United States Patent
Payton

(10) Patent No.: US 11,481,159 B2
(45) Date of Patent: Oct. 25, 2022

(54) SYSTEM, METHOD, AND COMPUTER PROGRAM PRODUCT FOR GENERATING A DATA STORAGE SERVER DISTRIBUTION PATTERN

(71) Applicant: Visa International Service Association, San Francisco, CA (US)

(72) Inventor: Paul Max Payton, San Carlos, CA (US)

(73) Assignee: Visa International Service Association, San Francisco, CA (US)

( * ) Notice: Subject to any disclaimer, the term of this patent is extended or adjusted under 35 U.S.C. 154(b) by 627 days.

(21) Appl. No.: 16/531,803

(22) Filed: Aug. 5, 2019

(65) Prior Publication Data
US 2021/0042036 A1  Feb. 11, 2021

(51) Int. Cl.
*G06F 3/06* (2006.01)
*G06F 11/10* (2006.01)
*H03M 13/15* (2006.01)

(52) U.S. Cl.
CPC .......... *G06F 3/067* (2013.01); *G06F 3/0614* (2013.01); *G06F 3/0644* (2013.01); *G06F 3/0655* (2013.01); *G06F 3/0683* (2013.01); *G06F 11/102* (2013.01); *H03M 13/1515* (2013.01)

(58) Field of Classification Search
CPC ...... G06F 3/067; G06F 3/0604; G06F 3/0644; G06F 2212/1032; G06F 3/0614; G06F 3/0655; G06F 3/0683; G06F 11/102; H03M 13/1515
See application file for complete search history.

(56) References Cited

U.S. PATENT DOCUMENTS

| | | | |
|---|---|---|---|
| 9,448,883 B1 * | 9/2016 | Shrader | G06F 11/108 |
| | | | 714/1 |
| 2004/0010742 A1 * | 1/2004 | Williamson | G11B 20/1833 |
| | | | 714/746 |
| 2010/0064166 A1 * | 3/2010 | Dubnicki | G06F 11/1076 |
| | | | 714/1 |

(Continued)

OTHER PUBLICATIONS

Musto et al. "Entropy-Based Reliability Analysis for Intelligent Machines" IEEE Transactions on Systems, vol. 27. (Year: 1997).*

(Continued)

*Primary Examiner* — Yuk Ting Choi
(74) *Attorney, Agent, or Firm* — The Webb Law Firm

(57) ABSTRACT

Described are a system, method, and computer program product for generating a data storage server distribution pattern. The method includes determining a set of servers and raw data to be stored. The method also includes transforming the raw data according to an error-correcting code scheme to produce distributable data. The method further includes determining a server reliability of each server in the set of servers. The method further includes generating the data storage server distribution pattern based on maximizing a system reliability relative to maximizing a system entropy. System reliability may be based on a minimum reliability of the set of servers, and system entropy may be based on a cumulated information entropy of each server of the set of servers. The method further includes distributing the distributable data to be stored across at least two servers of the set of servers according to the data storage server distribution pattern.

20 Claims, 7 Drawing Sheets

(56) References Cited

U.S. PATENT DOCUMENTS

| | | | |
|---|---|---|---|
| 2011/0307758 A1* | 12/2011 | Fillingim | G06F 11/1048 714/E11.03 |
| 2012/0166818 A1* | 6/2012 | Orsini | H04L 9/14 713/193 |
| 2013/0275545 A1* | 10/2013 | Baptist | H04L 67/42 709/215 |

OTHER PUBLICATIONS

Dai et al. "Uncertainty Analysis in Software Reliability Modeling by Bayesian Approach with Maximum- Entropy Principle", vol. 33 (Year: 2007).*

Beach, "Backblaze Open Sources Reed-Solomon Erasure Coding Source Code", https://www.backblaze.com/blog/reed-solomon/, Jun. 16, 2015, 6 pages.

* cited by examiner

SYSTEM, METHOD, AND COMPUTER PROGRAM PRODUCT FOR GENERATING A DATA STORAGE SERVER DISTRIBUTION PATTERN

BACKGROUND

1. Technical Field

Disclosed embodiments or aspects relate generally to networked data storage, and, in one particular embodiment or aspect, to a system, method, and computer program product for generating a data storage server distribution pattern across multiple servers.

2. Technical Considerations

To increase the reliability of data backups, data may be distributed across multiple servers. However, duplicating data on multiple servers may be memory intensive and inefficient, particularly if a set of data is duplicated in full on each individual backup server. Moreover, if a backup server belongs to a third party, there is also the risk of the third party accessing the stored data, which may be a security concern. To mitigate memory inefficiencies and the risk of third party access to stored data, portions of the data may be partially on each individual server, so that the overall memory use is reduced and so that no one third party has access to all the data. However, this reduces the usefulness of the backup system.

Error-correcting code schemes may be used to transform and store a portion of data in a manner that the entirety of the data can be determined, or "reconstructed," from the portion alone by a central data distributor, thereby reducing memory requirements. However, such error-correcting code schemes do not provide for a method of storing the transformed data across a set of available servers, nor do they provide a motivation for creating a server distribution pattern that might further improve storage efficiencies, increase system reliability, and reduce security risks.

There is a need in the art for a system and method of generating a data storage server distribution pattern, particularly one that leverages the advantages of error-correcting code schemes. There is a need for such a system and method that minimizes data storage requirements, maximizes system reliability, prevents third party reverse-engineering of data, and allows for data to be recovered and redistributed if a server of a set of servers becomes inoperative.

SUMMARY

Accordingly, and generally, provided is an improved system, method, and computer program product for generating a data storage server distribution pattern. Preferably, provided is a system, method, and computer program product for determining a set of servers and raw data to be stored. Preferably, provided is a system, method, and computer program product for transforming the raw data according to an error-correcting code scheme to produce distributable data and determine a server reliability of each server in the set of servers. Preferably, provided is a system, method, and computer program product for generating the data storage server distribution pattern based on maximizing a system reliability relative to maximizing a system entropy and distributing the distributable data across at least two servers of the set of servers according to the data storage server distribution pattern.

According to non-limiting embodiments or aspects, provided is a computer-implemented method for generating a data storage server distribution pattern. The method includes determining, with at least one processor, a set of servers. The method also includes determining, with at least one processor, raw data to be stored. The method further includes transforming, with at least one processor, the raw data according to an error-correcting code scheme to produce distributable data. The method further includes determining, with at least one processor, a server reliability of each server in the set of servers. The method further includes generating, with at least one processor, the data storage server distribution pattern based on maximizing a system reliability relative to maximizing a system entropy. The system reliability is determined at least partly by a minimum reliability yielded from permuting error vectors over various partitions of the distributable data across the set of servers. The system entropy is determined at least partly by a cumulated information entropy of each server of the set of servers using a probability mass function based on a ratio of bits stored on a given server relative to a total number of bits in the distributable data. The method further includes distributing, with at least one processor, the distributable data to be stored across at least two servers of the set of servers according to the data storage server distribution pattern.

In some non-limiting embodiments or aspects, the error-correcting code scheme may be a Reed-Solomon error-correcting code scheme. The number of bits in the distributable data may be at least twice a number of bits in the raw data.

In some non-limiting embodiments or aspects, the data storage server distribution pattern may be generated by weighting the system reliability and the system entropy to determine a pattern of distributed bits having a maximum value for the combined system reliability and system entropy. The maximum value for the combined system reliability and system entropy may be determined by iterating over all possible partitions of the distributable data across the set of servers. The maximum value for the combined system reliability and system entropy may be determined by iterating over permutations of partitions of bit allocations to identify an optimal assignment of bits to the set of servers. The maximum value for the combined system reliability and system entropy may be determined by a genetic algorithm permuting over a random subset of partitions of the distributable data.

In some non-limiting embodiments or aspects, the method may include encrypting, with at least one processor, the raw data prior to transforming the raw data according to the error-correcting code scheme to produce the distributable data.

In some non-limiting embodiments or aspects, the method may include, in response to a server of the at least two servers becoming inoperative, retrieving, with at least one processor, a portion of the distributable data from at least one operative server. The method may also include determining, with at least one processor, the raw data from the portion of the distributable data using the error-correcting code scheme. The method may further include transforming, with at least one processor, the raw data according to an error-correcting code scheme to produce new distributable data. The method may further include generating, with at least one processor, a new data storage server distribution pattern based on maximizing the system reliability relative to maximizing the system entropy. The system reliability may be determined at least partly by a minimum reliability yielded from permuting error vectors over various partitions of the new distributable data across the set of servers excluding the inoperative server. The system entropy may be determined at least partly by a cumulated information entropy of each server of the set of servers excluding the inoperative server using a probability mass function based on a ratio of bits stored on a given server relative to a total number of bits in the new distributable data. The method may further include distributing, with at least one processor, the new distributable data to be stored across at least two servers of the set of servers excluding the inoperative server according to the new data storage server distribution pattern.

According to non-limiting embodiments or aspects, provided is a system for generating a data storage server distribution pattern, the system comprising a server comprising at least one processor, the server being programmed and/or configured to determine a set of servers and determine raw data to be stored. The server is also programmed and/or configured to transform the raw data according to an error-correcting code scheme to produce distributable data. The server is further programmed and/or configured to determine a server reliability of each server in the set of servers. The server is further programmed and/or configured to generate the data storage server distribution pattern based on maximizing a system reliability relative to maximizing a system entropy. The system reliability is determined at least partly by a minimum reliability yielded from permuting error vectors over various partitions of the distributable data across the set of servers. The system entropy is determined at least partly by a cumulated information entropy of each server of the set of servers using a probability mass function based on a ratio of bits stored on a given server relative to a total number of bits in the distributable data. The server is further programmed and/or configured to distribute the distributable data to be stored across at least two servers of the set of servers according to the data storage server distribution pattern.

In some non-limiting embodiments or aspects, the data storage server distribution pattern may be generated by weighting the system reliability and the system entropy to determine a pattern of distributed bits having a maximum value for the combined system reliability and system entropy.

In some non-limiting embodiments or aspects, the maximum value for the combined system reliability and system entropy may be determined by a genetic algorithm permuting over a random subset of partitions of the distributable data.

In some non-limiting embodiments or aspects, the server may be further programmed and/or configured to encrypt the raw data prior to transforming the raw data according to the error-correcting code scheme to produce the distributable data.

In some non-limiting embodiments or aspects, the server may be further programmed and/or configured to, in response to a server of the at least two servers becoming inoperative, retrieve a portion of the distributable data from at least one operative server. The server may be further programmed and/or configured to determine the raw data from the portion of the distributable data using the error-correcting code scheme. The server may be further programmed and/or configured to transform the raw data according to an error-correcting code scheme to produce new distributable data. The server may be further programmed and/or configured to generate a new data storage server distribution pattern based on maximizing the system reliability relative to maximizing the system entropy. The system reliability may be determined at least partly by a minimum reliability yielded from permuting error vectors over various partitions of the new distributable data across the set of servers excluding the inoperative server. The system entropy may be determined at least partly by a cumulated information entropy of each server of the set of servers excluding the inoperative server using a probability mass function based on a ratio of bits stored on a given server relative to a total number of bits in the new distributable data. The server may be further programmed and/or configured to distribute the new distributable data to be stored across at least two servers of the set of servers excluding the inoperative server according to the new data storage server distribution pattern.

According to non-limiting embodiments or aspects, provided is a computer program product for generating a data storage server distribution pattern, the computer program product comprising at least one non-transitory computer-readable medium including program instructions that, when executed by at least one processor, cause the at least one processor to determine a set of servers and raw data to be stored. The program instructions also cause the at least one processor to transform the raw data according to an error-correcting code scheme to produce distributable data. The program instructions further cause the at least one processor to determine a server reliability of each server in the set of servers. The program instructions also cause the at least one processor to generate the data storage server distribution pattern based on maximizing a system reliability relative to maximizing a system entropy. The system reliability is determined at least partly by a minimum reliability yielded from permuting error vectors over various partitions of the distributable data across the set of servers. The system entropy is determined at least partly by a cumulated information entropy of each server of the set of servers using a probability mass function based on a ratio of bits stored on a given server relative to a total number of bits in the distributable data. The program instructions further cause the at least one processor to distribute the distributable data to be stored across at least two servers of the set of servers according to the data storage server distribution pattern.

In some non-limiting embodiments or aspects, the data storage server distribution pattern may be generated by weighting the system reliability and the system entropy to determine a pattern of distributed bits having a maximum value for the combined system reliability and system entropy.

In some non-limiting embodiments or aspects, the maximum value for the combined system reliability and system entropy may be determined by a genetic algorithm permuting over a random subset of partitions of the distributable data.

In some non-limiting embodiments or aspects, the program instructions may further cause the at least one processor to, in response to a server of the at least two servers becoming inoperative, retrieve a portion of the distributable data from at least one operative server. The program instructions may further cause the at least one processor to determine the raw data from the portion of the distributable data using the error-correcting code scheme. The program instructions may further cause the at least one processor to transform the raw data according to an error-correcting code scheme to produce new distributable data. The program instructions may further cause the at least one processor to generate a new data storage server distribution pattern based on maximizing the system reliability relative to maximizing the system entropy. The system reliability may be determined at least partly by a minimum reliability yielded from permuting error vectors over various partitions of the new distributable data across the set of servers excluding the inoperative server. The system entropy may be determined at least partly by a cumulated information entropy of each server of the set of servers excluding the inoperative server using a probability mass function based on a ratio of bits stored on a given server relative to a total number of bits in the new distributable data. The program instructions may further cause the at least one processor to distribute the new distributable data to be stored across at least two servers of the set of servers excluding the inoperative server according to the new data storage server distribution pattern.

Other non-limiting embodiments or aspects of the present disclosure will be set forth in the following numbered clauses:

Clause 1: A computer-implemented method for generating a data storage server distribution pattern, the method comprising: determining, with at least one processor, a set of servers; determining, with at least one processor, raw data to be stored; transforming, with at least one processor, the raw data according to an error-correcting code scheme to produce distributable data; determining, with at least one processor, a server reliability of each server in the set of servers; generating, with at least one processor, the data storage server distribution pattern based on maximizing a system reliability relative to maximizing a system entropy, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data; and distributing, with at least one processor, the distributable data to be stored across at least two servers of the set of servers according to the data storage server distribution pattern.

Clause 2: The method of clause 1, wherein the error-correcting code scheme is a Reed-Solomon error-correcting code scheme and a number of bits in the distributable data is at least twice a number of bits in the raw data.

Clause 3: The method of clause 1 or 2, wherein the data storage server distribution pattern is generated by weighting the system reliability and the system entropy to determine a pattern of distributed bits having a maximum value for the combined system reliability and system entropy.

Clause 4: The method of any of clauses 1-3, wherein the maximum value for the combined system reliability and system entropy is determined by iterating over all possible partitions of the distributable data across the set of servers.

Clause 5: The method of any of clauses 1-4, wherein the maximum value for the combined system reliability and system entropy is determined by iterating over permutations of partitions of bit allocations to identify an optimal assignment of bits to the set of servers.

Clause 6: The method of any of clauses 1-5, wherein the maximum value for the combined system reliability and system entropy is determined by a genetic algorithm permuting over a random subset of partitions of the distributable data.

Clause 7: The method of any of clauses 1-6, further comprising encrypting, with at least one processor, the raw data prior to transforming the raw data according to the error-correcting code scheme to produce the distributable data.

Clause 8: The method of any of clauses 1-7, further comprising, in response to a server of the at least two servers becoming inoperative: retrieving, with at least one processor, a portion of the distributable data from at least one operative server; and determining, with at least one processor, the raw data from the portion of the distributable data using the error-correcting code scheme.

Clause 9: The method of any of clauses 1-8, further comprising: transforming, with at least one processor, the raw data according to an error-correcting code scheme to produce new distributable data; generating, with at least one processor, a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and distributing, with at least one processor, the new distributable data to be stored across at least two servers of the set of servers excluding the inoperative server according to the new data storage server distribution pattern.

Clause 10: A system for generating a data storage server distribution pattern, the system comprising a server comprising at least one processor, the server being programmed and/or configured to: determine a set of servers; determine raw data to be stored; transform the raw data according to an error-correcting code scheme to produce distributable data; determine a server reliability of each server in the set of servers; generate the data storage server distribution pattern based on maximizing a system reliability relative to maximizing a system entropy, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data; and distribute the distributable data to be stored across at least two servers of the set of servers according to the data storage server distribution pattern.

Clause 11: The system of clause 10, wherein the data storage server distribution pattern is generated by weighting the system reliability and the system entropy to determine a pattern of distributed bits having a maximum value for the combined system reliability and system entropy.

Clause 12: The system of clause 10 or 11, wherein the maximum value for the combined system reliability and system entropy is determined by a genetic algorithm permuting over a random subset of partitions of the distributable data.

Clause 13: The system of any of clauses 10-12, wherein the server is further programmed and/or configured to encrypt the raw data prior to transforming the raw data according to the error-correcting code scheme to produce the distributable data.

Clause 14: The system of any of clauses 10-13, wherein the server is further programmed and/or configured to, in response to a server of the at least two servers becoming inoperative: retrieve a portion of the distributable data from at least one operative server; and determine the raw data from the portion of the distributable data using the error-correcting code scheme.

Clause 15: The system of any of clauses 10-14, wherein the server is further programmed and/or configured to: transform the raw data according to an error-correcting code scheme to produce new distributable data; generate a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and distribute the new distributable data to be stored across at least two servers of the set of servers excluding the inoperative server according to the new data storage server distribution pattern.

Clause 16: A computer program product for generating a data storage server distribution pattern, the computer program product comprising at least one non-transitory computer-readable medium including program instructions that, when executed by at least one processor, cause the at least one processor to: determine a set of servers; determine raw data to be stored; transform the raw data according to an error-correcting code scheme to produce distributable data; determine a server reliability of each server in the set of servers; generate the data storage server distribution pattern based on maximizing a system reliability relative to maximizing a system entropy, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data; and distribute the distributable data to be stored across at least two servers of the set of servers according to the data storage server distribution pattern.

Clause 17: The computer program product of clause 16, wherein the data storage server distribution pattern is generated by weighting the system reliability and the system entropy to determine a pattern of distributed bits having a maximum value for the combined system reliability and system entropy.

Clause 18: The computer program product of clause 16 or 17, wherein the maximum value for the combined system reliability and system entropy is determined by a genetic algorithm permuting over a random subset of partitions of the distributable data.

Clause 19: The computer program product of any of clauses 16-18, wherein the program instructions further cause the at least one processor to, in response to a server of the at least two servers becoming inoperative: retrieve a portion of the distributable data from at least one operative server; and determine the raw data from the portion of the distributable data using the error-correcting code scheme.

Clause 20: The computer program product of any of clauses 16-19, wherein the program instructions further cause the at least one processor to: transform the raw data according to an error-correcting code scheme to produce new distributable data; generate a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and distribute the new distributable data to be stored across at least two servers of the set of servers excluding the inoperative server according to the new data storage server distribution pattern.

These and other features and characteristics of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the present disclosure. As used in the specification and the claims, the singular form of "a," "an," and "the" include plural referents unless the context clearly dictates otherwise.

BRIEF DESCRIPTION OF THE DRAWINGS

Additional advantages and details of the disclosure are explained in greater detail below with reference to the exemplary embodiments that are illustrated in the accompanying schematic figures, in which.

DETAILED DESCRIPTION

Figure 1:
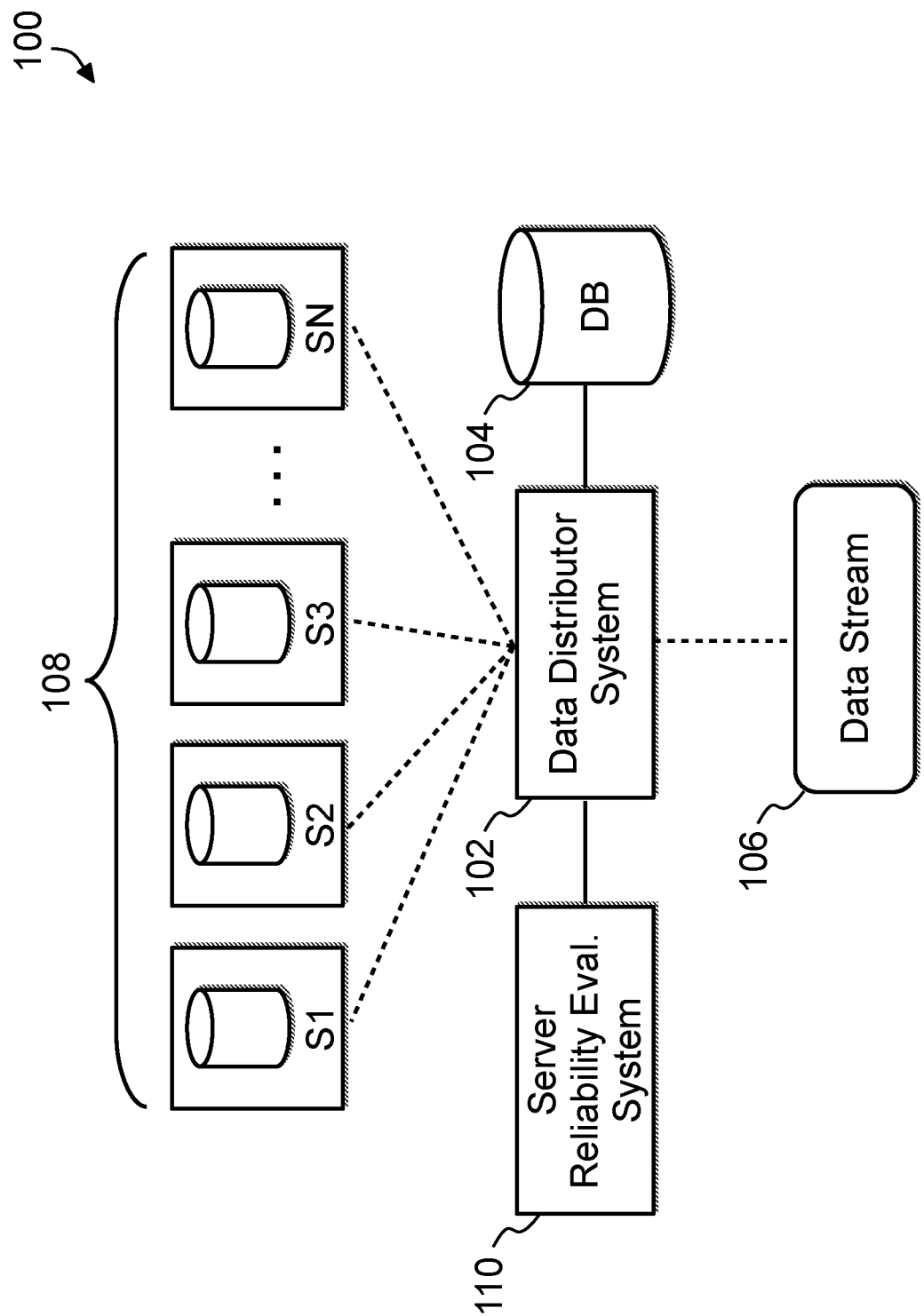
FIG. 1 is a schematic diagram of one embodiment or aspect of a system and method for generating a data storage server distribution pattern.

For purposes of the description hereinafter, the terms "upper", "lower", "right", "left", "vertical", "horizontal", "top", "bottom", "lateral", "longitudinal," and derivatives thereof shall relate to non-limiting embodiments as they are oriented in the drawing figures. However, it is to be understood that non-limiting embodiments may assume various alternative variations and step sequences, except where expressly specified to the contrary. It is also to be understood that the specific devices and processes illustrated in the attached drawings, and described in the following specification, are simply exemplary embodiments. Hence, specific dimensions and other physical characteristics related to the embodiments disclosed herein are not to be considered as limiting.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Furthermore, as used herein, the term "set" is intended to include one or more items (e.g., related items, unrelated items, a combination of related and unrelated items, etc.) and may be used interchangeably with "one or more" or "at least one." Where only one item is intended, the term "one" or similar language is used. Also, as used herein, the terms "has," "have," "having," or the like are intended to be open-ended terms. Further, the phrase "based on" is intended to mean "based at least partly on" unless explicitly stated otherwise.

Some non-limiting embodiments are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, and/or the like.

As used herein, the terms "communication" and "communicate" may refer to the reception, receipt, transmission, transfer, provision, and/or the like, of information (e.g., data, signals, messages, instructions, commands, and/or the like). For one unit (e.g., a device, a system, a component of a device or system, combinations thereof, and/or the like) to be in communication with another unit means that the one unit is able to directly or indirectly receive information from and/or transmit information to the other unit. This may refer to a direct or indirect connection (e.g., a direct communication connection, an indirect communication connection, and/or the like) that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit (e.g., a third unit located between the first unit and the second unit) processes information received from the first unit and communicates the processed information to the second unit. In some non-limiting embodiments, a message may refer to a network packet (e.g., a data packet, and/or the like) that includes data. Any known electronic communication protocols and/or algorithms may be used such as, for example, TCP/IP (including HTTP and other protocols), WLAN (including 802.11 and other radio frequency-based protocols and methods), analog transmissions, cellular networks (e.g., Global System for Mobile Communications (GSM), Code Division Multiple Access (CDMA), Long-Term Evolution (LTE), Worldwide Interoperability for Microwave Access (WiMAX), etc.), and/or the like. It will be appreciated that numerous other arrangements are possible.

As used herein, the term "mobile device" may refer to one or more portable electronic devices configured to communicate with one or more networks. As an example, a mobile device may include a cellular phone (e.g., a smartphone or standard cellular phone), a portable computer (e.g., a tablet computer, a laptop computer, etc.), a wearable device (e.g., a watch, pair of glasses, lens, clothing, and/or the like), a personal digital assistant (PDA), and/or other like devices. The term "client device," as used herein, refers to any electronic device that is configured to communicate with one or more servers or remote devices and/or systems. A client device may include a mobile device, a network-enabled appliance (e.g., a network-enabled television, refrigerator, thermostat, and/or the like), a computer, a POS ("point-of-sale") system, and/or any other device or system capable of communicating with a network.

As used herein, the term "computing device" may refer to one or more electronic devices that are configured to directly or indirectly communicate with or over one or more networks. The computing device may be a mobile device. As an example, a mobile device may include a cellular phone (e.g., a smartphone or standard cellular phone), a portable computer, a wearable device (e.g., watches, glasses, lenses, clothing, and/or the like), a personal digital assistant (PDA), and/or other like devices. The computing device may not be a mobile device, such as a desktop computer. Furthermore, the term "computer" may refer to any computing device that includes the necessary components to receive, process, and output data, and normally includes a display, a processor, a memory, an input device, and a network interface. An "application" or "application program interface" (API) refers to computer code or other data sorted on a computer-readable medium that may be executed by a processor to facilitate the interaction between software components, such as a client-side front-end and/or server-side back-end for receiving data from the client. An "interface" refers to a generated display, such as one or more graphical user interfaces (GUIs) with which a user may interact, either directly or indirectly (e.g., through a keyboard, mouse, etc.).

As used herein, the term "transaction service provider" may refer to an entity that receives transaction authorization requests from merchants or other entities and provides guarantees of payment, in some cases through an agreement between the transaction service provider and an issuer institution. For example, a transaction service provider may include a payment network such as Visa® or any other entity that processes transactions. The term "transaction processing system" may refer to one or more computer systems operated by or on behalf of a transaction service provider, such as a transaction processing server executing one or more software applications, a token service executing one or more software applications, and/or the like. A transaction processing server may include one or more processors and, in some non-limiting embodiments, may be operated by or on behalf of a transaction service provider.

As used herein, the term "account identifier" may include one or more PANs, tokens, or other identifiers associated with a customer account. The term "token" may refer to an identifier that is used as a substitute or replacement identifier for an original account identifier, such as a PAN. Account identifiers may be alphanumeric or any combination of characters and/or symbols. Tokens may be associated with a PAN or other original account identifier in one or more data structures (e.g., one or more databases and/or the like) such that they may be used to conduct a transaction without directly using the original account identifier. In some examples, an original account identifier, such as a PAN, may be associated with a plurality of tokens for different individuals or purposes.

As used herein, the term "server" or "server computer" may refer to or include one or more processors or computers, storage devices, or similar computer arrangements that are operated by or facilitate communication and processing for multiple parties in a network environment, such as the Internet, although it will be appreciated that communication may be facilitated over one or more public or private network environments and that various other arrangements are possible. Further, multiple computers, e.g., servers, or other computerized devices, e.g., POS devices, directly or indirectly communicating in the network environment may constitute a "system," such as a cloud provider system. Reference to "a server" or "a processor," as used herein, may refer to a previously-recited server and/or processor that is recited as performing a previous step or function, a different server and/or processor, and/or a combination of servers and/or processors. For example, as used in the specification and the claims, a first server and/or a first processor that is recited as performing a first step or function may refer to the same or different server and/or a processor recited as performing a second step or function. A configuration of bits of data to be stored across one or more server may be referred to herein as a "data storage distribution pattern."

Non-limiting embodiments or aspects of the present disclosure are directed to a system, method, and computer program product for generating a data storage server distribution pattern. The described arrangement of network architecture and components therein are configured to transform raw data to be stored into distributable data by an error-correcting code scheme, to allow for non-overlapping portions of the data to be distributed across a plurality of servers, minimizing data storage requirements while also allowing for the entire data to be reconstructed by the data distributor from less than the entire data. Moreover, the data may be encrypted prior to applying an error-correcting code scheme, further providing additional layers of security against third party server hosts from reconstructing the entire data or interpreting portions of the data. The portions of data distributed across servers may be intentionally segmented so that no one server stores the entirety of any data parameter or field.

The described systems and methods further provide a technically improved data storage server distribution pattern by maximizing a system reliability (e.g., an evaluation of system uptime, availability, likelihood of a server not becoming inoperative, and the like) relative to maximizing a system entropy (e.g., an evaluation of the data segmentation distribution minimizing occurrences of any one server having a greater proportion of data). The balance of objectives of procedurally maximizing system reliability while also maximizing system entropy provides the technical benefit of simultaneously improved system security and improved storage network accessibility. Moreover, the various permutations of partitions of bits of distributable data may be iterated to assure an absolute combined maximum system reliability and system entropy. Additionally, a genetic algorithm may be employed to more quickly determine a relative or absolute combined maximum system reliability and system entropy, allowing for such an improved data storage server distribution pattern to be generated at faster rates, thereby reducing system delay in executing a distribution and shortening the time for subsequent data recall. These advantages, among others, are demonstrated by the detailed technical non-limiting embodiments below.

Error-correcting codes are a class of techniques that take data and add redundancy so that the data may be transmitted in the presence of noise. The redundancy is added so that, if a part of the data is missing, transposed, etc., the entire sequence of data may be reconstructed. For example, a Hamming code known as a checksum pad may add parity bits for row and column sums, allowing for single error correction/double error detection.

Error-correcting code schemes may be used to allow data to be stored reliably for recall and backup. For example, a piece of data such as a PAN may be encoded using an error-correcting code scheme, which expands the data with redundant information. The encoded PAN may then be segmented across multiple servers so that no one server has enough information to reproduce the original data (e.g., the full PAN). Also, in the case where one or more servers become unavailable, e.g., due to outages, the error-correcting code allows for reconstruction of the original data if sufficient data are present in the available servers.

An error correction scheme may be applied to a single data item consisting of k bits. For example, an error correction scheme may be applied to a PAN consisting of 16 decimal digits. This would require 64 bits to store/transmit (16 digits×4 bits/digit) while un-encoded. The resultant encoded data may have size n bits, where n≥k. Further, these n encoded bits may be distributed over a set of servers, having total number C servers, with each server having a reliability n, where the index i ranges from 0 to C−1. Assume an objective of minimum system reliability R. The data distributor may determine L out of the C servers (where L < C) in order to produce sufficient obfuscation of the data item (e.g., to partition the data item into portions so no one server has enough of the data item to deduce the data item content). It may be an objective to meet or exceed R overall reliability (typically stated in "nines," e.g., "six nines" equals 99.999999%) in total.

Many different error correction schemes operate on either the symbol level (digit or character) or the bit level. These are generally divided into two classe: block and convolutional codes. Block codes are a large family of error-correcting codes that encode data in blocks. Examples of block codes include Reed-Solomon codes, Hamming codes, Hadamard codes, Expander codes, Golay codes, and Reed-Muller codes. These may be referred to as algebraic block codes or cyclic block codes, because such codes can be generated using Boolean polynomials. Algebraic block codes are typically hard-decoded using algebraic decoders. The term block code may also refer to any error-correcting code that acts on a block of k bits of input data to produce n bits of output data. By contrast, convolutional codes work on bit or symbol streams of arbitrary length. Convolutional codes may be decoded with the Viterbi algorithm, though other algorithms may be used. Viterbi decoding allows asymptotically optimal decoding efficiency with increasing constraint length of the convolutional code, but at the expense of exponentially increasing complexity (e.g., time). A terminated convolutional code is a block code in that it encodes a block of input data but the block size of a convolutional code is arbitrary. Block codes have a fixed size, dictated by their algebraic characteristics.

Both block code and convolutional code families can be represented as $(n,k,d)_q$, where q is the size of the alphabet of symbols (e.g., $2^M$ ... where M is 4 for decimal/hexadecimal, 8 for ASCII characters, and 16 for UNICODE wide characters), n is the block length (e.g., encoded message length), k is the pure message length (e.g., un-encoded message length), and d (distance) is the minimum number of positions in which any two distinct code words can differ in terms of Hamming distance. This value of d determines the number of errors, $\lfloor(d-1)/2\rfloor$, that can be corrected in the coded message. For the maximum distance separable code, distance may be defined to be $d=n-k+1$. However, the precise distance may not be known, non-trivial to prove or state, or not needed. For the present disclosure, d may be predetermined.

The probability of a single bit error occurring in data may be defined using bit error rate (BER), where a bit error is a bit improperly stored/retrieved (e.g., on one or more stored media or retrieved from a cloud network) or sent/received (e.g., over a telecommunications system). The BER may be in the range of $10^{-6}$ to $10^{-9}$, yielding a reliability value (a complement of the BER) between 0.999999 (e.g., 99.9999% "four nines") to 0.999999999 (e.g., 99.9999999%, "seven nines"), respectively. The reliability of N bits all being sent/received or stored/retrieved correctly is given as the product of each bit remaining intact: $1-(1-BER)^N$.

By extension, the total reliability of k bits out of n is given by the binomial sum of all possible combinations of 0 . . . k garbled bits out of n bits:

$$\sum_{i=0}^{k}\binom{n}{i}(1-BER)^{n-i}BER^{i} \qquad \text{Formula 1}$$

In terms of reliability (r=1−BER), this quantity is given by:

$$\sum_{i=0}^{k}\binom{n}{i}r^{n-i}(1-r)^{i} \qquad \text{Formula 2}$$

Given a data item of k bits, the desired solution (e.g., allocation of bits) may be a choice of n encoded bits (k+d), along with a vector of C values, L of which are non-zero. This vector may represent how many of those n bits get allocated to each server. The sum of these integer components of the vector will be n. The choice of n and the vector solution will meet at least two objectives: (1) efficiently maximize the use of available servers; and (2) produce an overall reliability of a data item of at least R or greater.

One goal may be efficiently maximizing the use of the available servers (e.g., distributing the n bits across L or more servers) to obfuscate the encoding of a data item so that no one server will contain enough of the data item to reconstruct or deduce the underlying data item (e.g., exploiting personally identifiable information). The distribution may be described as being the entropy of the signal. Mathematically, this may define a function that describes the smear/distribution of bits across available servers. Thus, if the total number of bits is n and the number of bits assigned to server i is $b_i$, the probability mass function (denoted $p_i$) is n and the entropy of the distributed bits may be represented as:

$$E = -\sum_{i=0}^{C-1} p_i \log_2 p_i \qquad \text{Formula 3}$$

with the objective of maximizing the value of E.

For example: if k=16 bits and d is predetermined to be 17 (e.g., only $\lfloor(d-1)/2\rfloor$ or eight bit errors are correctible), then n may be 16+17−1=32 bits (k+d−1). If there are C=7 servers in the set of available servers and the data distributor determines to use L=5 providers, consider a vector such as [0,7,7,4,7,7,0] for the bit allocation vector $b_i$ yielding a probability mass vector of [0, 0.21875, 0.21875, 0.125, 0.21875, 0.21875, 0.0]. This produces a total entropy value E of 2.2935644432 for this example. The entropy E could be increased by selecting a more uniform distribution (e.g., "smear") across all the servers available (e.g., [5,5,5,2,5,5,5], yielding an E of 2.760692411).

Another goal may be, given known reliabilities $r_i$ of a collection of servers C, to select an encoding (n,k,d) that produces an overall reliability of a data item of at least R or greater when the encoded data is stored across a proper subset L (L≤C) of servers. Mathematically, the "best worst case" is to be ensured, that the collection of selected servers yield reliability better than R, subject to the entropy constraint. This constraint may not be met; it is possible that no combination of servers results in an overall "best worst case" that meets or exceeds R. In such case, the data distributor may seek the maximum achievable reliability. The constraints may also be weighted to give greater or lesser importance to the objectives.

In order for the encoded message (of length n) to be properly decoded, no more than (n−k)/2 or d bit errors may occur. These d errors are distributed across servers, which requires consideration of partitioning, e.g., determining how many ways d can be written as the sum of L positive non-zero integers.

By way of continuing the prior example, consider that if d is 17, no more than $\lfloor(d-1)/2\rfloor$ or eight bit errors are correctible. This is a worst-case scenario. Also, as before, for C=7 (seven servers to choose from) and L=5 (at least five servers of the possible seven must be chosen), there are only three possible non-zero partitions of the eight bit errors. In lexicographic order:
[4, 1, 1, 1, 1]
[3, 2, 1, 1, 1]
[2, 2, 2, 1, 1]

A data distributor would be interested in ensuring the overall worst-case reliability remains above R, which requires the consideration of permutations. For example, if L is 5 and the number of available servers C is 7, then two servers are assigned zero bits (they are unused). In such a case, two servers would be omitted from being allocated data. The data distributor would therefore discard the two least reliable servers. This is a factor of the reliabilities of the individual servers. If the server reliabilities are [0.999, 0.99995, 0.99997, 0.99995, 0.99996, 0.999998, 0.9993], assigning the first and last servers zero bits makes sense. However, another permutation of [0,7,7,4,7,7,0] might be used for a different set of reliability numbers. Determining which servers are unused and which servers are assigned bits is important in computing the overall reliability. For each of those five non-zero partitions, there are five factorial (5! or 120) permutations possible (some of which will be duplicates).

Servers may be sorted in the order of their reliability, and the bottom-scoring servers, in terms of reliability numbers, may be dropped and/or ignored. This may be adopted as a general pre-conditioning practice to maximize reliability and to reduce and possibly eliminate the need to examine all those many permutations.

By way of further definition, the number of bits assigned to the servers may be represented as an integer vector $b_i$ (as before) and the number of bit errors occurring in the servers may be represented as another integer vector $e_i$. The sum of all the components of should equal the total number of bits n. In other words, the n bits are somehow distributed over the servers. Every component of $b_i$ is an integer between 0 and n. Likewise, the sum of all the components of the error vector $e_i$ must be less than or equal to $\lfloor(d-1)/2\rfloor$ or the data item cannot be recovered. Finally, there is an upper limit for all the values of e: every component of $e_i$ must be less than or equal to its corresponding component in $b_i$ (namely, a server cannot have more bit errors than the number of bits stored thereon).

The reliabilities of all the servers may be represented by a floating-point vector $r_i$. All the values of this vector may be between 0.0 and 1.0 (e.g., ideally all extremely close to 1.0). The values may be sorted in decreasing order of reliability, with the most reliable provider first and the least reliable provider last. The value $\lfloor(d-1)/2\rfloor$ may be denoted as the variable m (for maximum number of bit errors tolerable). Let Part(v,k) be a sequence of k-wise partitions of the integer v. In other words, the various ways of splitting up the integer v into k components may be determined, in which some of the components may be zero, and in which the k components add up to v. To illustrate, the three-wise partitions of three may be represented as Partition(3,3)={[3,0,0], [2,1,0], [1,1,1]}.

Let Len(v) be the number of elements of a vector v. To illustrate, if v=[1,2,3], then Len([1,2,3])=3. Let Perm(s) be all the permutations of a vector of integers. To illustrate, the six ordered permutations [3!=6] of Perm([0,1,2]) are {[0,1,2], [0,2,1], [1,0,2], [1,2,0], [2,0,1], [2,1,0]}.

The number of bits in the data, k, may be known. The data distributor may select m, the number of tolerable bit errors, which determines d. An allocation of bits to servers vector may be determined using some algorithm (discussed further below). That allocation vector $b_i$ may be scored against $r_i$, the reliability vector. The data distributor may iterate over all possible error vectors which are L-wise partitions of d across C servers with (C-L) zeroes. For each of these partitions, the reliability may be computed for all allowable vector permutations of that partition (e.g., ones where the $e_i$ components are less than or equal to the $b_i$ components). The lowest score may be taken as a metric. Formulaically, this is:

$$R = \min_{e \in Perm(Part(m,L))} \bigwedge_{i=0 \ldots L-1}^{e \leq b} \prod_{i=0}^{L} \sum_{j=0}^{e_i} \binom{b_i}{j} r_i^{b_i - j} (1 - r_i)^j \quad \text{Formula 4}$$

By way of further explanation, for a fixed value of m, all permutations (e.g., rearrangements) of all L-wise partitions of m (e.g., the "min" operator) are produced. This is may be a sequence of e vectors. For all e vectors whose components are less than or equal to their corresponding components in the b vector (e.g., the inverted V symbol, meaning "AND"), the products of the reliability functions may be computed across the set of servers (e.g., a product of sums). So, each e vector may produce an associated reliability. Of all those reliability values, the minimum value may be used as the reliability metric R.

In view of the foregoing, provided are two computable metrics, E (entropy) and R (reliability), which pull the solution space in opposite directions. To obtain a larger value for E (e.g., to segment the data into chunks to obfuscate the data), the data distributor could distribute the allocation of bits across the b vector uniformly (e.g., allocate the same number of bits to as many servers as possible to maximize entropy). To obtain a larger value for R (e.g., to ensure recovery of the original k bits of data in the presence of bit errors), the data distributor could assign larger numbers of bits to the components of the b vector that are associated with the servers with high reliability. Since servers may be sorted in decreasing order of reliability, larger $b_i$ numbers would be arranged early on in the vector. It will be appreciated that it may not be possible to fully satisfy both objectives simultaneously. The data distributor might need to increase/decrease m and retry the entire process. Or the data distributor may wish to weight the E and/or R functions to give greater or lesser priority to one or the other function, where the E function measures obfuscation of the data and the R function measures reliability of recovering the data from the distributed encoding. The design of this approach allows for adjustment, customization, and dynamic implementation.

With two metrics and approaches to choosing or weighting one over the other, an algorithm may be determined. With k, the number of bits in the data, the data distributor may select a minimum value for m, the number of tolerable bit errors, which determines d. The data distributor may increase m by one until arriving at a solution that produces an E and R that meets the system needs, or the data distributor may stop at some point where m is a reasonable factor of k. Then, the data distributor may decide on some allocation of bits to the set of servers—the $b_i$ vector.

In one approach, the data distributor may iterate over all C-wise partitions of n (with zeroes allowed) and run those partitions through the E and R computation process. While this process may take more computation time, the computation may be completed only once before the actual encoding and storage of bits in the servers is done. This approach may also guarantee a best-possible set of values for E and R.

Another approach may be to generate a random subset of C-wise partitions of n and use a genetic algorithm to permute these values in search of maximizing the E and R objective functions. To do this, the data distributor may encode a population of solutions in the form $\{m,[b_0,b_1, \ldots, b_{C-2}, b_{C-1}]\}$, compute the E and R objective functions for this population, and apply operations (e.g., permutation, grafting, etc.) on individual putative solutions to converge on the most optimal (e.g., high value) solution. This approach has the advantage of likely reducing the computation time of a fully iterative approach.

It will be appreciated that many approaches, or combinations thereof, may be possible to this maximization problem in integer space. The outcome of any given approach (e.g., algorithm) may be a choice for m (e.g., how many bits are needed to augment the original k bits to obtain an n bit encoding with high reliability) and a choice for $b_i$ (e.g., the allocation of those n bits to servers that assure obfuscation and high reliability).

With specific reference to FIG. 1, and in some non-limiting embodiments or aspects, provided is a system 100 for generating a data storage server distribution pattern. The system 100 includes a data distributor system 102 having one or more servers for receiving data to be stored. The data distributor system 102 may be programmed and/or configured to generate one or more data storage server distribution pattern and communicate data to and from a set of servers 108. The data distributor system 102 may be communicatively connected to other sets of servers other than the exemplary illustrated set of servers 108. The set of servers 108 may include two or more servers, e.g., a first server (S1), a second server (S2), a third server (S3), and up to and including an nth server (SN). The data distributor system 102 may receive raw data to be stored on the set of servers 108. The data distributor system 102 may receive the raw data from a database 104, which may store the raw data as an additional storage medium or may temporarily store the raw data until it is distributed among the set of servers 108. Other servers and systems may populate the database 104 with raw data to be distributed. The data distributor system 102 may also receive the raw data from a data stream 106, such as a data stream of transaction data representing processed transactions from a transaction service provider system. A database 104 source of raw data may be considered to include any source of at least temporarily stored data from a data storage medium. A data stream 106 source of raw data may be considered to include directly or indirectly communicated data that is transmitted to the data distributor system 102 after generation. Raw data may be communicated to the data distributor system 102 through a combination of databases 104 or data streams 106.

The data distributor system 102 may determine the set of servers 108 (e.g., two or more servers), on which raw data (transformed or non-transformed) may be stored. The raw data may be transformed by the data distributor system 102 according to an error-correcting code scheme to produce distributable data for storage on the set of servers 108. The raw data may also be transformed by another server prior to being communicated to the data distributor system 102 via a database 104 or a data stream 106. The raw data may also be encrypted prior to transformation by an error-correcting code scheme. The data distributor system 102 may also determine a server reliability of each server in the set of servers 108. Server reliability may be computed, such as by determining an actual or projected server uptime, likelihood of failure, rate of data communication success, and/or similar metrics. Server reliability may also be reported, such as from one or more cloud providers associated with one or more servers of the set of servers 108. Server reliability for each server in the set of servers 108 may also be determined by a server reliability evaluation system 110. The server reliability evaluation system 110 may monitor activity on one or more servers to determine a reliability score for each server. The server reliability evaluation system 110 may be coextensive with the data distributor system 102.

The data distributor system 102 may then generate a data storage server distribution pattern of the distributable data. Portions of the distributable data (e.g., bits) may be allocated to two or more servers of the set of servers 108. Not all of the servers 108 need be selected for storing portions of the distributable data. The data storage server distribution pattern may be based on maximizing a system reliability of the set of servers 108 relative to maximizing a system entropy of the set of servers 108. The system reliability may be determined (by the server reliability evaluation system 110, the data distributor system 102, etc.) at least partly by a minimum reliability yielded from permuting error vectors over various partitions of the distributable data across the set of servers 108. The system entropy may be determined (by the server reliability evaluation system 110, the data distributor system 102, etc.) at least partly by a cumulated information entropy of each server of the set of servers 108 using a probability mass function based on a ratio of bits stored on a given server relative to a total number of bits in the distributable data. A non-limiting method of determining system reliability and system entropy is described herein.

Given a generated data storage server distribution pattern, the data distributor system 102 may distribute the distributable data for storage across two or more servers of the set of servers 108 according to the data storage server distribution pattern. If one or more servers of the set of servers 108 become inoperative, the data distribution server 102 may retrieve a portion of the distributable data from one or more other operative servers. Using the error-correcting code scheme that was used to transform the raw data into the distributable data, the data distributor system 102 may determine the raw data from the portion of the distributable data. Thereafter, the data distributor system 102 may attempt a new distribution of the data based on the remaining operative servers in the set of servers 108.

The raw data determined from the portion of distributable data may be transformed again by the data distributor system 102 to produce new distributable data, according to an error-correcting code scheme. A same or different error-correcting code scheme may be employed to generate the new distributable data. The data distributor system 102 may then generate a new data storage server distribution pattern across two or more operative servers of the set of servers 108. The new data storage server distribution pattern may be based on maximizing the system reliability relative to maximizing the system entropy. The system reliability may be determined at least partly by a minimum reliability yielded from permuting error vectors over various partitions of the new distributable data across the set of servers excluding the one or more inoperative servers. The system entropy may be determined at least partly by a cumulated information entropy of each server of the set of servers excluding the one or more inoperative servers using a probability mass function based on a ratio of bits stored on a given server relative to a total number of bits in the new distributable data. After generating the new data storage server distribution pattern, the data distributor system 102 may distribute the new distributable data for storage across at least two servers of the set of servers, excluding the one or more inoperative servers.

Figure 2:
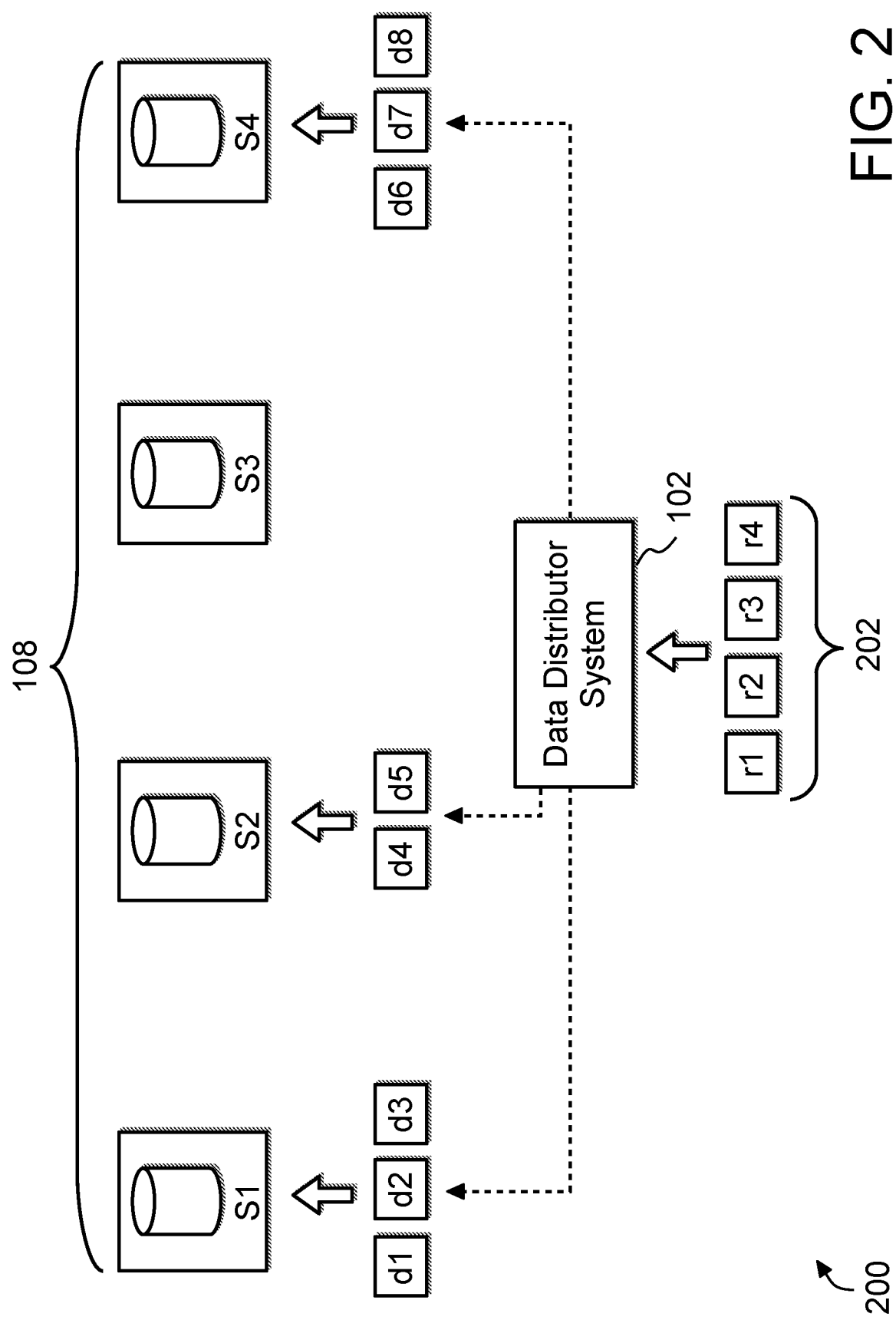
FIG. 2 is a schematic diagram of one embodiment or aspect of a system and method for generating a data storage server distribution pattern.
Figure 3:
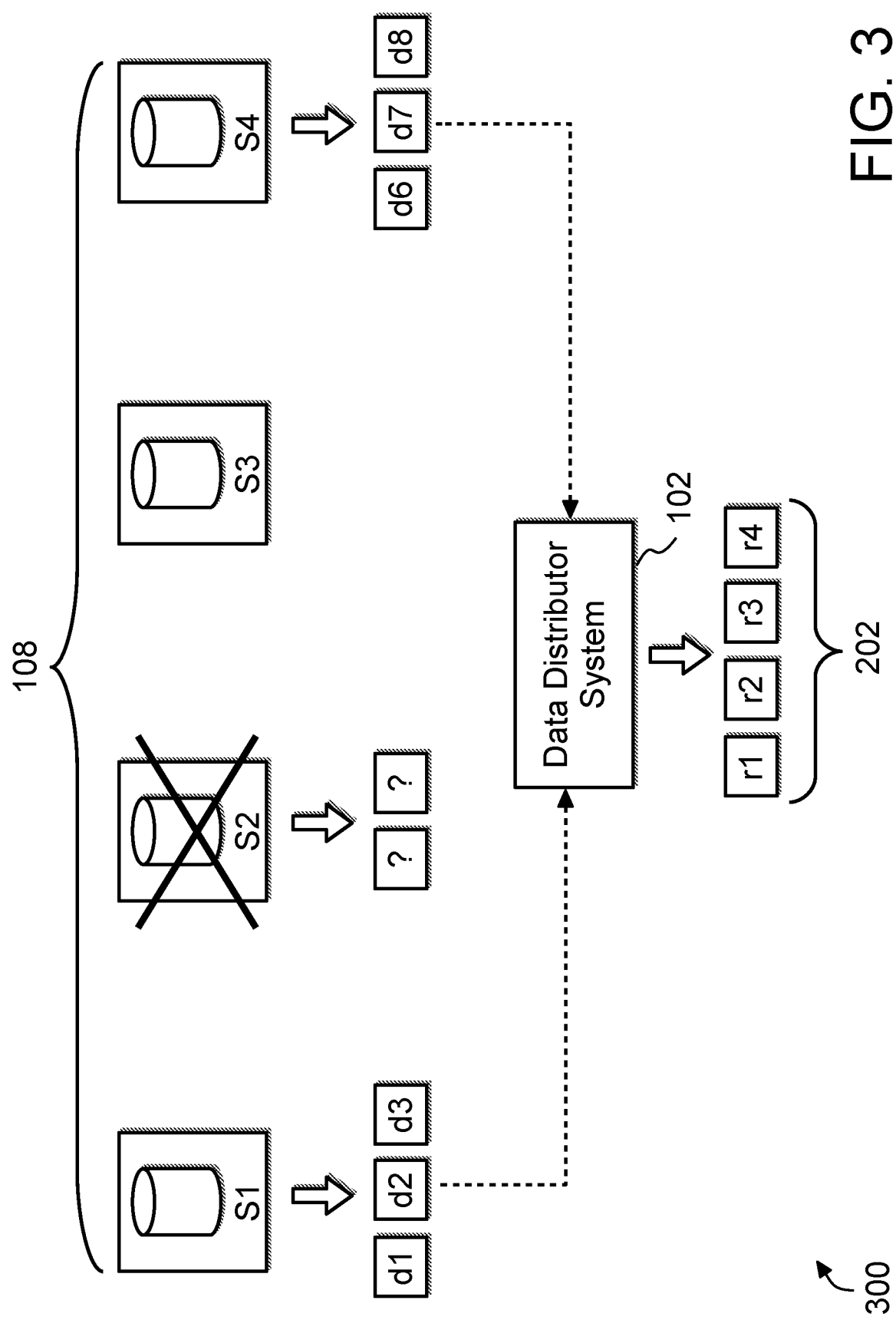
FIG. 3 is a schematic diagram of one embodiment or aspect of a system and method for generating a data storage server distribution pattern.
Figure 4:
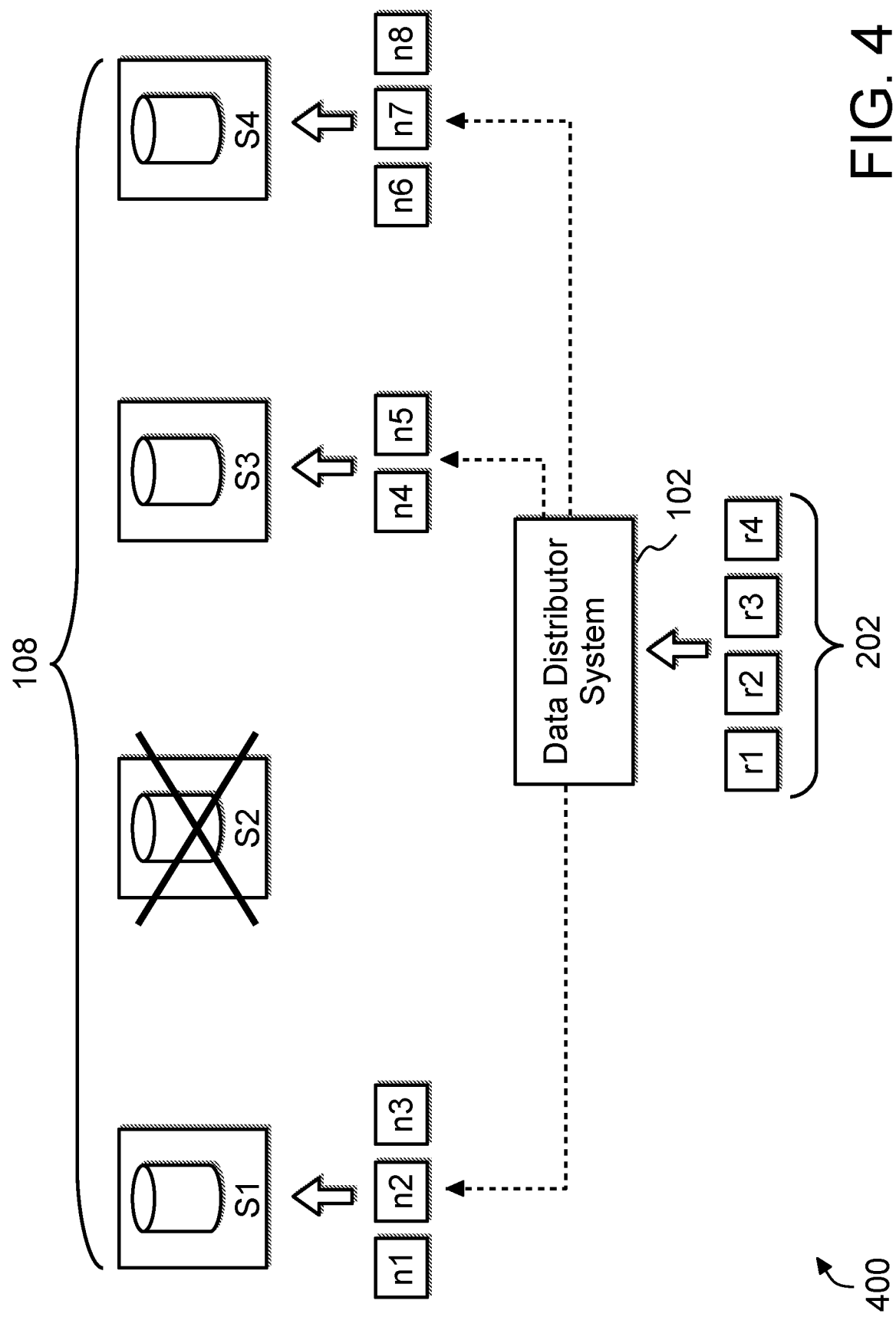
FIG. 4 is a schematic diagram of one embodiment or aspect of a system and method for generating a data storage server distribution pattern.

With specific reference to FIGS. 2-4, and in some non-limiting embodiments or aspects, provided are relational diagrams 200, 300, 400 of a system and method for generating a data storage server distribution pattern. Illustrated for ease of understanding is a data distributor system 102, a set of servers 108 including four servers S1-S4, and raw data 202 having four bits r1-r4, which is transformed into distributable data d1-d8. It will be appreciated that various other arrangements are possible.

With continued reference to FIG. 2, and in further non-limiting embodiments or aspects, the data distributor system 102 may determine the set of servers 108 on two or more servers of which data will be stored. The data distributor system 102 may be communicatively connected to each server of the set of servers 108, or a system associated therewith, e.g., a cloud provider system. The data distributor system 102 may also determine the raw data 202 to be stored (e.g., by receiving a communication including data for data storage, by accessing a database containing stored data, etc.). The data distributor system 102 may transform the raw data 202 according to an error-correcting code scheme to produce distributable data d1-d8. The data distributor system 102 may determine a server reliability of search server in the set of servers. For illustrative purposes, server S3 may be assumed to have a lower reliability score than server S2, which may be assumed to have a lower reliability score than server S1 or server S4. The data distributor system 102 may also determine how many servers of the set of servers 108 on which to store data. For illustrative purposes in this non-limiting example, only three of the four servers S1-S4 will be used in an initial round of data storage. The determination of how many servers may be used may be always maximized, may be predetermined by system parameters, may be dynamically determined according to server availability, cost, etc., and/or other similar methods.

The data distributor system 102 may then generate the data storage server distribution pattern based on maximizing a system reliability relative to maximizing a system entropy. For illustrative purposes, system entropy may be maximized by achieving a relatively uniform distribution of bits across the three servers S1, S2, and S4, and system reliability may be maximized relative to system entropy by eliminating the lowest reliability server S3 from consideration as one of the three servers for storage, and then distributing fewer bits (d4, d5) to the second-lowest reliable server S2. As such, three bits of distributable data d1, d2, d3 are assigned to server S1, two bits of distributable data d4, d5 are assigned to server S2, and three bits of distributable data d6, d7, d8 are assigned to server S4. It will be appreciated that the size of the raw data 202, the number of servers in the set of servers 108, and the number of servers chosen for storage may be scaled up or down as a given situation requires.

With continued reference to FIG. 3, and in further non-limiting embodiments or aspects, shown is an example scenario where the lowest-reliability server S2 has become inoperative. As such, distributable data bits d4, d5 are not recoverable. In response to S2 becoming inoperative, the data distributor system 102 may retrieve a portion of the distributable data from one or more of the remaining operative servers. As illustrated in this non-limiting example, distributable data bits d1, d2, d3, d6, d7, d8 may be retrieved by the data distributor system 102. From the retrieved portion of distributable data, the data distributor system 102 may determine the raw data 202 using the error-correcting code scheme that was used to transform the raw data 202 into the distributable data.

With continued reference to FIG. 4, and in further non-limiting embodiments or aspects, once the raw data 202 is determined, the data distributor system 102 may transform the raw data 202 into new distributable data n1-n8 using an error-correcting code scheme, which may be the same or different from the previously applied error-correcting code scheme. The data distributor system 102 may then generate a new data storage server distribution pattern based on maximizing the system reliability relative to maximizing the system entropy. After one or more servers become inoperative, the system reliability may be determined at least partly by a minimum reliability yielded from permuting error vectors over various partitions of the new distributable data n1-n8 across the set of servers excluding the one or more inoperative servers. The system entropy may be determined at least partly by a cumulated information entropy of each server of the set of servers excluding the one or more inoperative servers, using a probability mass function based on a ratio of bits stored on a given server relative to a total number of bits in the new distributable data n1-n8. The data distributor system 102 may then distribute the new distributable data n1-n8 across at least two servers of the set of servers (excluding the one or more inoperative servers) according to the new data storage server distribution pattern.

For illustrative purposes, after server S2 becomes inoperative, system entropy is maximized by achieving a relatively uniform distribution of bits across the three servers S1, S3, and S4. System reliability is maximized relative to system entropy by distributing fewer bits (n4, n5) to the least reliable server S3. As such, three bits of new distributable data n1, n2, n3 are assigned to server S1, two bits of new distributable data n4, n5 are assigned to server S3, and three bits of new distributable data n6, n7, n8 are assigned to server S4.

With continued reference to FIGS. 2-4, and in further non-limiting embodiments or aspects, it will be appreciated that multiple servers may become inoperative at any one time. It will also be appreciated that one or more bit errors in stored distributable data may occur without a server becoming inoperative, such that even while a given server can be communicated with, one or more bits of distributable data stored thereon cannot be retrieved or are not transmitted correctly. Bit errors may occur across more than one server. By transforming raw data intro distributable data using an error-correcting code scheme, one or more bit errors may occur, and one or more servers may become inoperative, while the raw data remains recoverable from the remaining portion of accessible distributable data.

Figure 5:
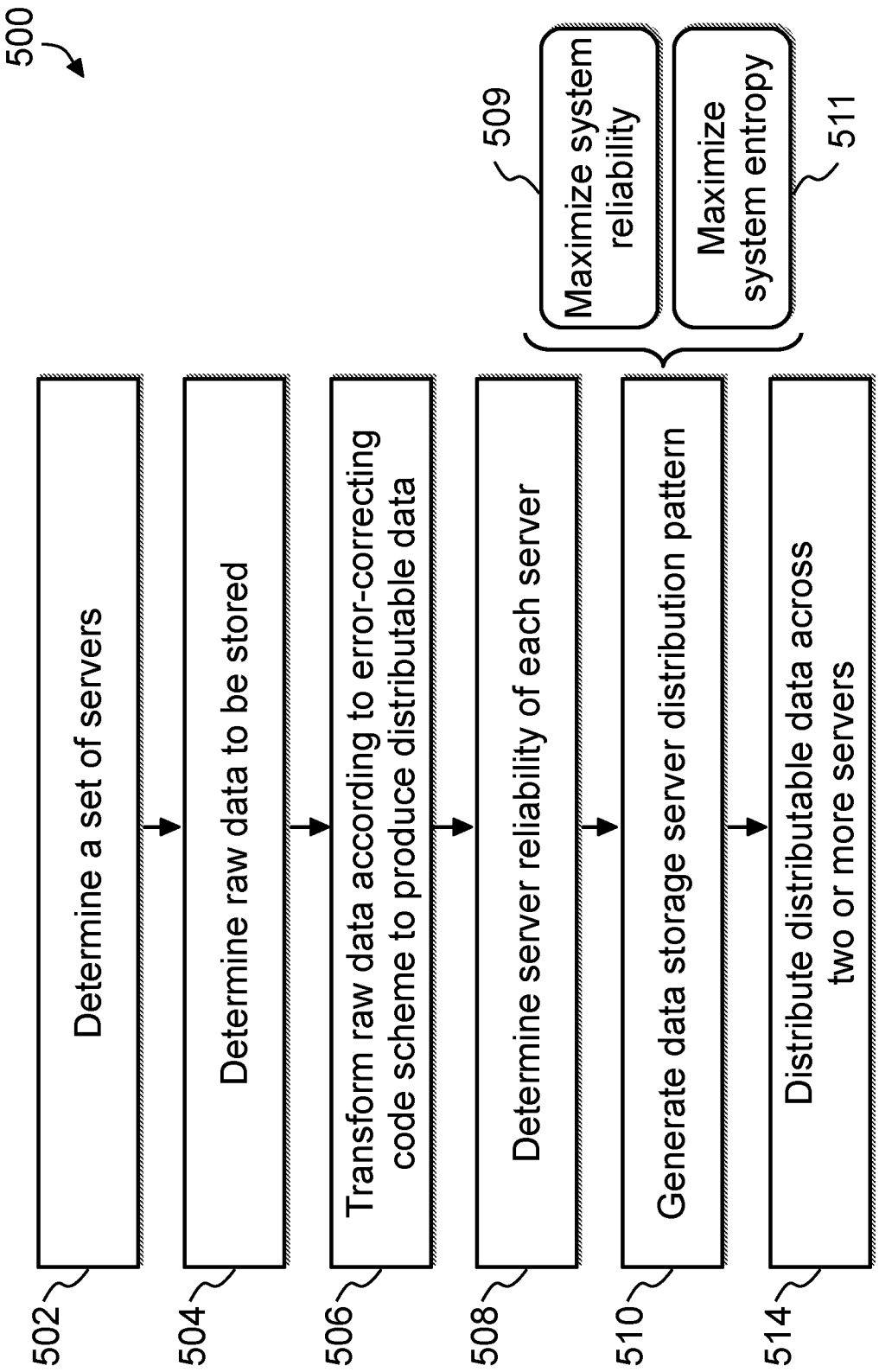
FIG. 5 is a process diagram of one embodiment or aspect of a system and method for generating a data storage server distribution pattern.

With specific reference to FIG. 5, and in some non-limiting embodiments or aspects, provided is a method 500 for generating a data storage server distribution pattern. The steps shown in method 500 may be completed by a data distributor system, a server reliability evaluation system, and/or one or more other servers communicatively connected to one or more servers for data storage. In step 502, the data distributor system may determine a set of servers, one or more of which may be used to store portions of distributed data. In step 504, the data distributor system may determine raw data to be stored. In step 506, the data distributor system may transform the raw data according to an error-correcting code scheme to produce distributable data. In step 508, the data distributor system may determine a server reliability of each server in the set of servers, which may be used for generation of the data storage server distribution pattern.

In step 510, the data distributor system may generate the data storage server distribution pattern. The data storage server distribution pattern may be based on maximizing a system reliability (step 509) relative to maximizing a system entropy (step 511). System reliability may be determined at least partly by a minimum reliability yielded from permuting error vectors over various partitions of the distributable data across the set of servers. System entropy may be determined at least partly by a cumulated information entropy of each server of the set of servers using a probability mass function based on a ratio of bits stored on a given server relative to a total number of bits in the distributable data. After generating the data storage server distribution pattern, the data distributor system may distribute, in step 514, the distributable data for storage across two or more servers of the set of servers according to the data storage server distribution pattern.

Figure 6:
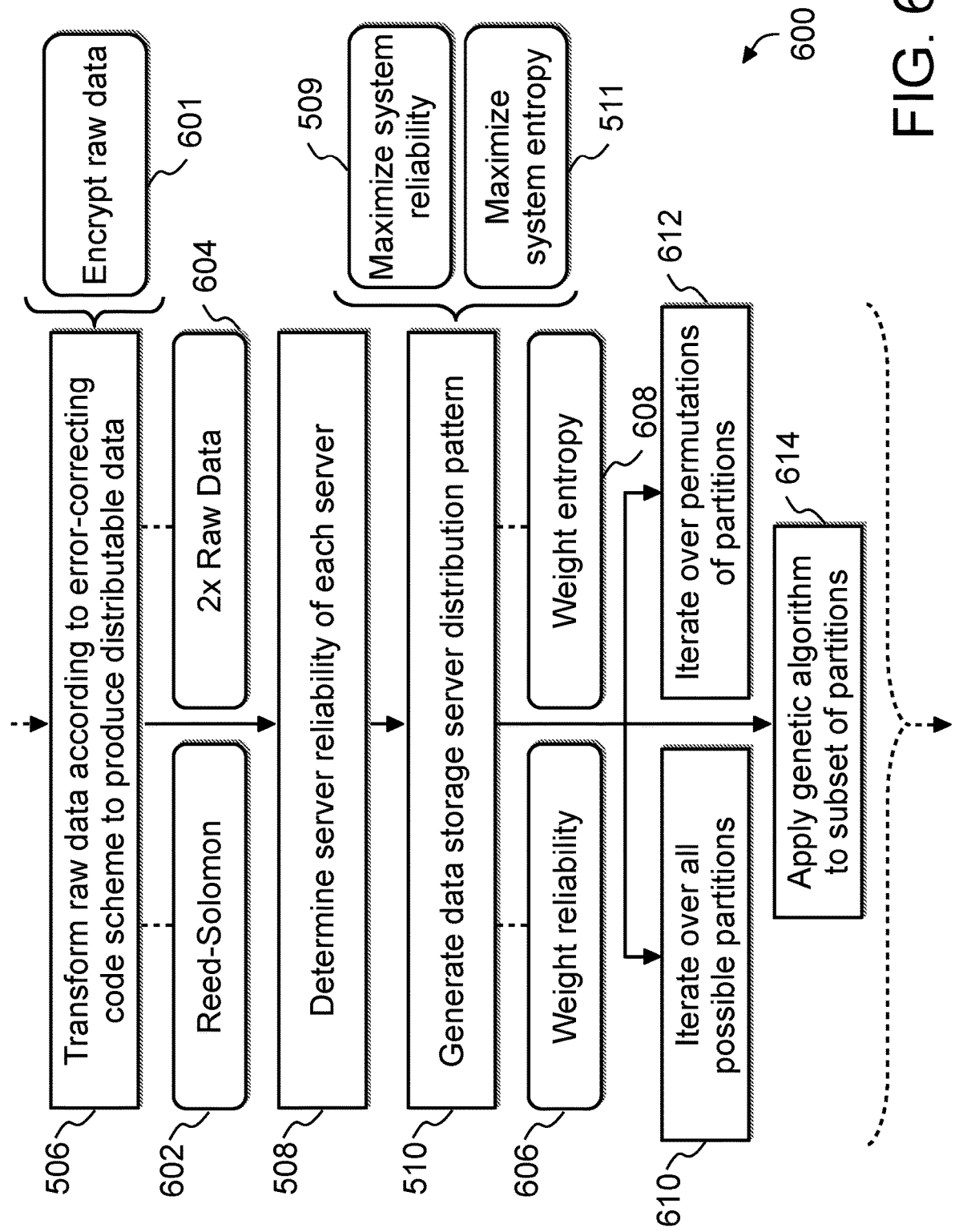
FIG. 6 is a process diagram of one embodiment or aspect of a system and method for generating a data storage server distribution pattern.

With specific reference to FIG. 6, and in some non-limiting embodiments or aspects, provided is a method 600 for generating a data storage server distribution pattern. The steps shown in method 600 may be completed by a data distributor system, a server reliability evaluation system, and/or one or more other servers communicatively connected to one or more servers for data storage. The method 500 of FIG. 5 may include the method of 600 of FIG. 6. In step 506, the data distributor system may transform the raw data according to an error-correcting code scheme to produce distributable data. Associated with step 506, the data distributor system may apply a Reed-Solomon error-correcting code scheme in step 602, and may generate a number of distributable bits that is at least twice a number of bits in the raw data in step 604. In step 508, the data distributor system may determine a server reliability of each server in the set of servers, which may be used for generation of the data storage server distribution pattern.

In step 510, the data distributor system may generate the data storage server distribution pattern. The data storage server distribution pattern may be based on maximizing a system reliability (step 509) relative to maximizing a system entropy (step 511). Associated with step 510, the data distributor system may also weight reliability (in step 606) and/or weight entropy (step 608) to give greater significance to one or the other when maximizing one score relative to another. System reliability may be determined at least partly by a minimum reliability yielded from permuting error vectors over various partitions of the distributable data across the set of servers. System entropy may be determined at least partly by a cumulated information entropy of each server of the set of servers using a probability mass function based on a ratio of bits stored on a given server relative to a total number of bits in the distributable data. In step 610, the data distributor system may determine a maximum value for the combined system reliability and system entropy by iterating over all possible partitions of the distributable data across the set of servers. In step 612, the data distributor system may determine maximum value for the combined system reliability and system entropy by iterating over permutations of partitions of bit allocations to identify an optimal assignment of bits to the set of servers. In step 614, the data distributor may determine the maximum value for the combined system reliability and system entropy by applying a genetic algorithm to permute over a random subset of partitions of the distributable data. After generating the data storage server distribution pattern, the data distributor system may distribute the distributable data for storage across two or more servers of the set of servers according to the data storage server distribution pattern.

Figure 7:
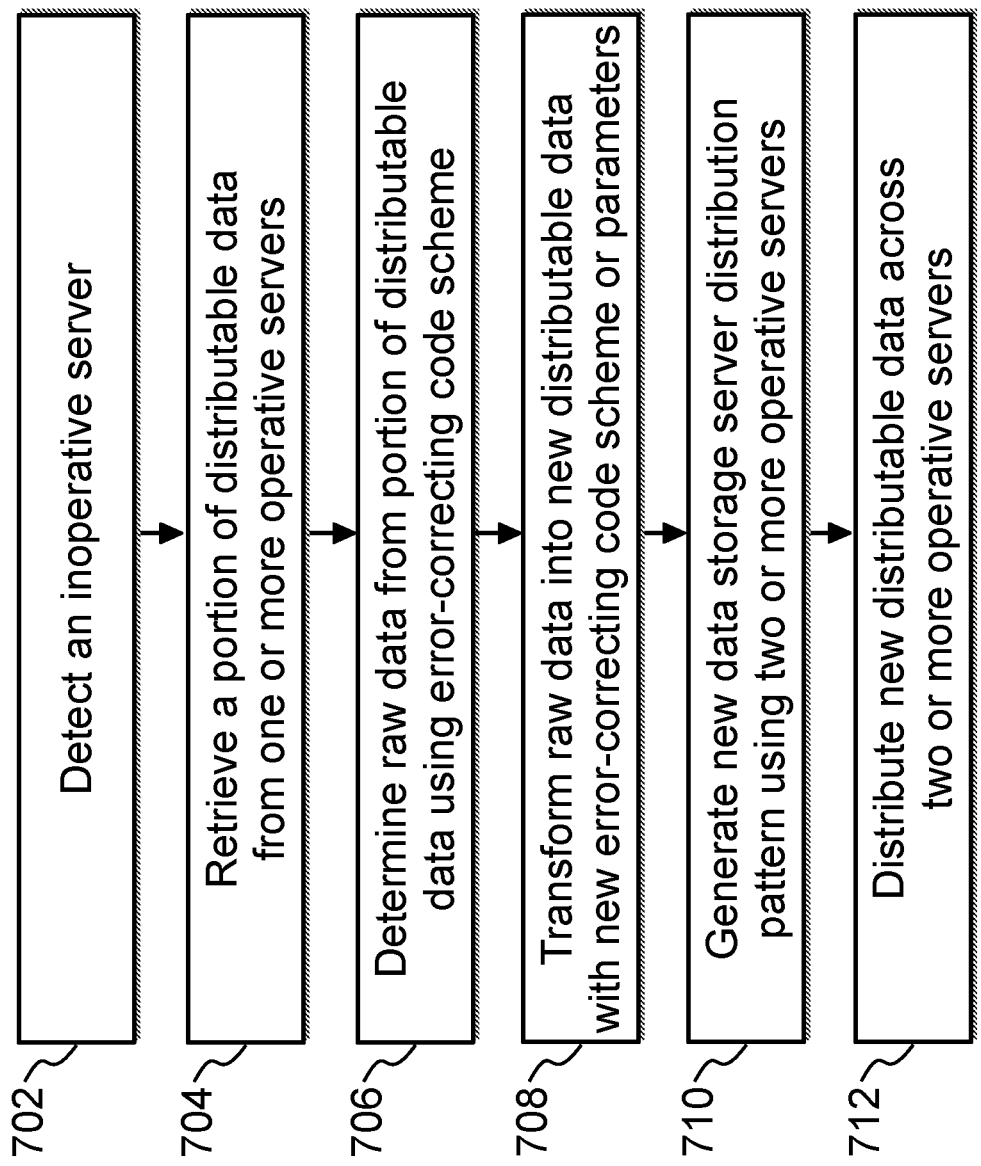
FIG. 7 is a process diagram of one embodiment or aspect of a system and method for generating a data storage server distribution pattern.

With specific reference to FIG. 7, and in some non-limiting embodiments or aspects, provided is a method 700 for generating a data storage server distribution pattern. The steps shown in method 700 may be completed by a data distributor system, a server reliability evaluation system, and/or one or more other servers communicatively connected to one or more servers for data storage. In step 702, the data distributor system may detect an inoperative server. The data distributor system may monitor the communicative status of one or more servers, and/or may be configured to receive operational status communications from one or more servers. In response to detecting an inoperative server, in step 702, the data distributor system may retrieve a portion of the distributable data from one or more operative servers, in step 704. In step 706, the data distributor system may determine the raw data from the portion of the distributable data using the error-correcting code scheme. In step 708, the data distributor system may transform the raw data into new distributable data with a new error-correcting code scheme or parameters thereof. The new error-correcting code scheme may also be the same as the previously applied error-correcting code scheme.

In step 708, the data distributor system may generate a new data storage server distribution pattern. The new data storage server distribution pattern may also be based on maximizing a system reliability relative to maximizing a system entropy. System reliability may be determined at least partly by a minimum reliability yielded from permuting error vectors over various partitions of the new distributable data across the set of servers, excluding the one or more inoperative servers. System entropy may be determined at least partly by a cumulated information entropy of each server of the set of servers (excluding the one or more inoperative servers) using a probability mass function based on a ratio of bits stored on a given server relative to a total number of bits in the new distributable data. After generating the new data storage server distribution pattern, the data distributor system may distribute, in step 712, the new distributable data for storage across two or more servers of the set of servers according to the new data storage server distribution pattern.

Although the disclosure has been described in detail for the purpose of illustration based on what is currently considered to be the most practical and non-limiting embodiments, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

What is claimed is:

1. A computer-implemented method for generating a data storage server distribution pattern, the method comprising:
   determining, with at least one processor, a set of servers;
   determining, with at least one processor, raw data to be stored;
   transforming, with at least one processor, the raw data according to an error-correcting code scheme to produce distributable data;
   determining, with at least one processor, a server reliability of each server in the set of servers;
   generating, with at least one processor, the data storage server distribution pattern based on maximizing a system reliability relative to maximizing a system entropy, wherein the data storage server distribution pattern comprises partitions such that no one server stores an entirety of the distributable data, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data;
   distributing, with at least one processor, the distributable data to be stored across at least two servers of the set of servers according to the data storage server distribution pattern; and
   storing, with at least one processor, the distributable data across the at least two servers according to the data storage server distribution pattern.

2. The method of claim 1, wherein the error-correcting code scheme is a Reed-Solomon error-correcting code scheme and a number of bits in the distributable data is at least twice a number of bits in the raw data.

3. The method of claim 1, wherein the data storage server distribution pattern is generated by weighting the system reliability and the system entropy to determine a pattern of distributed bits having a maximum value for the combined system reliability and system entropy.

4. The method of claim 3, wherein the maximum value for the combined system reliability and system entropy is determined by iterating over all possible partitions of the distributable data across the set of servers.

5. The method of claim 3, wherein the maximum value for the combined system reliability and system entropy is determined by iterating over permutations of partitions of bit allocations to identify an optimal assignment of bits to the set of servers.

6. The method of claim 3, wherein the maximum value for the combined system reliability and system entropy is determined by a genetic algorithm permuting over a random subset of partitions of the distributable data.

7. The method of claim 1, further comprising encrypting, with at least one processor, the raw data prior to transforming the raw data according to the error-correcting code scheme to produce the distributable data.

8. The method of claim 1, further comprising, in response to a server of the at least two servers becoming inoperative:
  retrieving, with at least one processor, a portion of the distributable data from at least one operative server; and
  determining, with at least one processor, the raw data from the portion of the distributable data using the error-correcting code scheme.

9. The method of claim 8, further comprising:
  transforming, with at least one processor, the raw data according to an error-correcting code scheme to produce new distributable data;
  generating, with at least one processor, a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and
  distributing, with at least one processor, the new distributable data to be stored across at least two servers of the set of servers excluding the inoperative server according to the new data storage server distribution pattern.

10. A system for generating a data storage server distribution pattern, the system comprising a server comprising at least one processor, the server being programmed and/or configured to:
  determine a set of servers;
  determine raw data to be stored;
  transform the raw data according to an error-correcting code scheme to produce distributable data;
  determine a server reliability of each server in the set of servers;
  generate the data storage server distribution pattern based on maximizing a system reliability relative to maximizing a system entropy, wherein the data storage server distribution pattern comprises partitions such that no one server stores an entirety of the distributable data, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data;
  distribute the distributable data to be stored across at least two servers of the set of servers according to the data storage server distribution pattern; and
  store the distributable data across the at least two servers according to the data storage server distribution pattern.

11. The system of claim 10, wherein the data storage server distribution pattern is generated by weighting the system reliability and the system entropy to determine a pattern of distributed bits having a maximum value for the combined system reliability and system entropy.

12. The system of claim 11, wherein the maximum value for the combined system reliability and system entropy is determined by a genetic algorithm permuting over a random subset of partitions of the distributable data.

13. The system of claim 10, wherein the server is further programmed and/or configured to encrypt the raw data prior to transforming the raw data according to the error-correcting code scheme to produce the distributable data.

14. The system of claim 10, wherein the server is further programmed and/or configured to, in response to a server of the at least two servers becoming inoperative:
  retrieve a portion of the distributable data from at least one operative server; and
  determine the raw data from the portion of the distributable data using the error-correcting code scheme.

15. The system of claim 14, wherein the server is further programmed and/or configured to:
  transform the raw data according to an error-correcting code scheme to produce new distributable data;
  generate a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and
  distribute the new distributable data to be stored across at least two servers of the set of servers excluding the inoperative server according to the new data storage server distribution pattern.

16. A computer program product for generating a data storage server distribution pattern, the computer program product comprising at least one non-transitory computer-readable medium including program instructions that, when executed by at least one processor, cause the at least one processor to:
  determine a set of servers;
  determine raw data to be stored;
  transform the raw data according to an error-correcting code scheme to produce distributable data;
  determine a server reliability of each server in the set of servers;
  generate the data storage server distribution pattern based on maximizing a system reliability relative to maximizing a system entropy, wherein the data storage server distribution pattern comprises partitions such that no one server stores an entirety of the distributable data, wherein the system reliability is determined at least partly by a minimum reliability yielded from permuting error vectors over various partitions of the distributable data across the set of servers, and wherein the system entropy is determined at least partly by a cumulated information entropy of each server of the set of servers using a probability mass function based on a ratio of bits stored on a given server relative to a total number of bits in the distributable data; distribute the distributable data to be stored across at least two servers of the set of servers according to the data storage server distribution pattern; and store the distributable data across the at least two servers according to the data storage server distribution pattern.

17. The computer program product of claim 16, wherein the data storage server distribution pattern is generated by weighting the system reliability and the system entropy to determine a pattern of distributed bits having a maximum value for the combined system reliability and system entropy.

18. The computer program product of claim 17, wherein the maximum value for the combined system reliability and system entropy is determined by a genetic algorithm permuting over a random subset of partitions of the distributable data.

19. The computer program product of claim 16, wherein the program instructions further cause the at least one processor to, in response to a server of the at least two servers becoming inoperative:

retrieve a portion of the distributable data from at least one operative server; and determine the raw data from the portion of the distributable data using the error-correcting code scheme.

20. The computer program product of claim 19, wherein the program instructions further cause the at least one processor to:

transform the raw data according to an error-correcting code scheme to produce new distributable data;

generate a new data storage server distribution pattern based on maximizing the system reliability relative to maximizing the system entropy, wherein the system reliability is determined at least partly by a minimum reliability yielded from permuting error vectors over various partitions of the new distributable data across the set of servers excluding the inoperative server, and wherein the system entropy is determined at least partly by a cumulated information entropy of each server of the set of servers excluding the inoperative server using a probability mass function based on a ratio of bits stored on a given server relative to a total number of bits in the new distributable data; and distribute the new distributable data to be stored across at least two servers of the set of servers excluding the inoperative server according to the new data storage server distribution pattern.

\* \* \* \* \*